United States Patent [19]
Ahn

[11] Patent Number: 5,284,787
[45] Date of Patent: Feb. 8, 1994

[54] METHOD OF MAKING A SEMICONDUCTOR MEMORY DEVICE HAVING IMPROVED ELECTRICAL CHARACTERISTICS

[75] Inventor: Ji-hong Ahn, Seoul, Rep. of Korea

[73] Assignee: Samsung Electronics Co., Ltd., Kyunggi, Rep. of Korea

[21] Appl. No.: 815,247

[22] Filed: Dec. 31, 1991

[30] Foreign Application Priority Data

Mar. 27, 1991 [KR] Rep. of Korea ............... 91-4793

[51] Int. Cl.$^5$ ............... H01L 21/70; H01L 27/00
[52] U.S. Cl. .............................. 437/52; 437/60; 437/919
[58] Field of Search ............ 437/52, 47, 48, 60; 257/296, 303–304, 306, 308, 310

[56] References Cited

U.S. PATENT DOCUMENTS 5,028,990 7/1991 Kotaki et al. ............... 357/23.6
5,100,825 3/1992 Fazan et al. ............... 437/52
5,155,057 10/1992 Dennison et al. ............... 437/47

Primary Examiner—Robert Kunemund
Assistant Examiner—H. Jey Tsai
Attorney, Agent, or Firm—Morgan & Finnegan

[57] ABSTRACT

A semiconductor memory device and the method therefor is disclosed, in which memory cells having a transistor that has a source, a drain and a gate electrode, and a capacitor that has a storage electrode electrically connected to the source of the transistor, a dielectric layer and a plate electrode are formed on a semiconductor substrate in an orderly shape. In the memory cell, a covering layer is formed over the entire semiconductor region, except for an area defined to form the storage electrode, so as to be both insulated from the lower structure and the storage electrode. Accordingly, not only is prevented the phenomenon that data stored in a cell capacitor is destroyed by the residue of a polycrystal silicon layer, but also the surface thereof can be flattened in advance, limited only by the thickness of the polycrystal silicon layer.

27 Claims, 7 Drawing Sheets

METHOD OF MAKING A SEMICONDUCTOR MEMORY DEVICE HAVING IMPROVED ELECTRICAL CHARACTERISTICS

BACKGROUND OF THE INVENTION

The present invention relates, in general, to a semiconductor memory device and the manufacturing method therefor and, more particularly, to a high density semiconductor memory device and the method thereof in which an electric characteristic is prevented from being destroyed by the residue of polycrystal silicon produced during the manufacturing process for either a stack type or a stack-trench type of capacitor.

Because the current state of technology in manufacturing high density memory devices is limited, a variety of problems occur as the memory cell density is increased. With regard to current etching technology, the problem is particularly acute because of a severe surface bending that increases with the increase in the number of manufacturing process steps undertaken.

In some situations when etching a material coated on a flat surface, consideration is not given to the creation of a possible new material by a chemical reaction which might occur between the coating material and the coated material or substance comprising the surface, and concern about a residue of coating material remaining on the surface after etching is not needed.

However, when the surface being etched is not a flat one, but instead contains a multitude of bends and curves, the situation is totally different. This is due to a phenomenon that occurs in which the thickness of the material coated on the curved surface becomes locally varied.

When a material having a fixed step coverage is coated over any shape of surface, its thickness is consistent on a flat surface, whereas it is not consistent at the parts of the curved surface. In other words, at either an edge or a wall of the step coverage, the coating material will be thinner, whereas it will be thicker in the corner where the wall of step and base meet.

When removing a coating material which has formed as described above, by using etching techniques, the coating material often remains in the corners at the end of the etching process. This is attributed to the excessive thickness of the coating material in the corner.

Materials which remain, even after the etching process has ended, are referred to as residue. This residue seriously obstructs operation of the memory device by forming stringers that act as electrical paths between the active regions formed on the substrate, and result in unwanted electrical conductivity between elements that should be isolated from each other.

The phenomena explained above, i.e., residue and stringers, is a problem which is evident primarily in the wiring process and is rather serious in any process in which a conductive material is used. It is especially problematic in a memory cell that is more highly integrated, and therefore the need to solve this problem become even more urgent.

In a DRAM (used as an acronym for "Dynamic Random Access Memory" throughout this description), and particularly in the stack type capacitor structure, a part of the polycrystal silicon layer coated to form a storage electrode must be removed in the process for limiting that storage electrode to a cell unit. However, since the polycrystal silicon is coated on a semiconductor substrate whose surface is curved near the gate electrode or bitline, the polycrystal silicon does not get completely removed from the corner portions of the curve during etching, which results in "stringers" of polycrystal residue being formed. These stringers serve as a bridge linking storage electrodes together between cells and cause problems such as storing inverted data in a memory cell, and degrading the memory storage characteristics of the cell.

Referring to FIG. 1A through FIG. 1C, an explanation of problems occurring in the process of manufacturing a stack type capacitor by using the conventional method is given herein. The sectional views as seen in these figures shown some of the sequential procedures for manufacturing a conventional stack-type capacitor, having a cylinder shaped storage electrode.

A transistor having source 14, drain 16 and gate electrode 18 is formed at an active region of a semiconductor substrate 10 and a bit line 20 is also formed to be connected with the drain 16. A contact hole for contacting with a storage electrode is formed by penetrating the surface of the source 14. A first polycrystalline silicon layer 100a, having been doped with an impurity, is formed over the whole surface of the semiconductor substrate on which the contact hole was formed. Here, the impurity is of the same type as that of the source region 14 as shown in FIG. 1A.

The whole surface of the semiconductor substrate on which the layer 100a has been formed is coated with an insulating layer, such as polyimide, TEOS(Tetia-Ethyl-Ortho Silicate), or the like, in such a manner that a flat surface is formed. Here, the thickness of the insulation layer 30 determines the height of the cylinder in the cylindric form storage electrode, which becomes the standard for measuring the cell's capacitance. Next, a sensitive film pattern is formed on the insulating layer using a mask pattern for forming a storage electrode, and by way of anisotropic etching, a part of the insulating layer is removed to form an insulating layer aperture in order to form the cylinder shaped storage electrode.

A second polycrystalline silicon layer is formed over the whole surface of the semiconductor substrate on which the aperture has been formed. Anisotropic etching is then performed, leaving a spacer consisting of the second polycrystalline silicon layer on the side wall of the insulating layer aperture. Because the first and second polycrystalline silicon layer have different etching rates for the anisotropic etching, only the second layer is removed at the lower part of the insulating layer aperture, whereas the first layer still remains and becomes shaped into linkage with the space (as shown in FIG. 1B).

The insulation layer 30 is removed by wet etching and a part of the first polycrystalline silicon layer is also removed by using a mask pattern for forming a storage electrode, thereby determining each cell and completing the cylindric shaped storage electrode that was formed by the first and second polycrystalline silicon layers. Next, a dielectric material having a high dielectric constant, such as, $Ta_2O_5$ or the like, is thinly coated over the entire surface to form a dielectric layer 60. A third polycrystalline silicon in deposited over the entire surface of the dielectric layer 60 to form a plate electrode. Cell capacitors $C_1$ and $C_2$, comprising storage electrodes 100 and 200, dielectric layer 60 and plate electrode 70, are completed (see FIG. 1C).

These prior art attempts to achieve an increase in the cell capacitance of the cylindrically shaped capacitor by forming an additional spacer having the second polycrystalline silicon layer on a base plate electrode consisting of the first polycrystalline silicon layer, has met with limited success. This is due to the fact that the degree of thickness of the first polycrystalline silicone layer formed in the curves on the semiconductor substrate created by sub-structure i.e., gate electrodes, bit line, and field oxide layer, (curves as shown in FIG. 1C bitline nook), impedes its complete removal even after the etching process is completed. Consequently, the first polysilicon layer residue 101 remains.

The residue, as shown in FIG. 1C, forms stringers that bridge connections between the cells at the nooks of the substrate surface, causing such problems as diverting the data stored in each cell sent to different cells via the bridging "stringer" connections and, deteriorating the device's overall reliability. Accordingly, the problem of residue removal occurring during the manufacture of capacitors remains a task that needs to be resolved in order to improve reliability, especially in the case of structuring capacitors of the stack type in a memory device.

SUMMARY OF THE INVENTION

It is an object of the present invention to provide a highly reliable semiconductor memory device in which the leakage of data stored in a cell capacitor is prevented, by placing a conductive material in advance in an area where a residue of conductive material may remain (due to the curvature of the surface) and then isolating the conductive material and a storage electrode from each other.

It is another object of the present invention to provide an appropriate method for manufacturing a reliable semiconductor memory device that eliminates the problem caused by unwanted residue of polycrystal silicon.

The first object of the present invention is achieved by providing a semiconductor memory device in which the memory cells are formed on a semiconductor substrate that is comprised of both a transistor having a source, drain and gate electrode and a capacitor having a storage electrode electrically coupled to the source of the transistor, dielectric layer and plate electrode in which a covering layer is formed from a material having a fine step coverage characteristic nature so as to be isolated from both the lower structure and the storage electrode in all regions except the region defined to form the storage electrode.

To achieve another object of the present invention, there is provided a process for manufacturing a memory device in which memory cells are formed in a regular shape on a semiconductor substrate comprising a transistor having a source, drain and gate electrode and a capacitor having a storage electrode electrically coupled to the source of the transistor, a dielectric layer and a plate electrode, such process including the steps of:

sequentially stacking up an etch blocking layer, first polycrystal silicone layer and an insulating layer whose surface is planarized on the overall surface of a semiconductor substrate on which the transistor is formed;

forming a sensitive film pattern for forming the storage electrode on the insulating layer;

patterning the insulating layer and first poly crystal silicon layer by using the sensitive film pattern as a mask;

forming a spacer layer on the overall surface of the resultant substrate;

forming a spacer on each sidewall of the patterned insulating layer and first polycrystal silicon layer, by etching the spacer layer;

forming a second polycrystal silicon layer on the overall surface of the semiconductor substrate on which the spacer has been formed;

completing a storage electrode by partially etching the second polycrystal silicon layer to isolate each cell unit;

removing at least a portion of the patterned insulating layer and spacer using etching techniques;

forming a dielectric layer on the overall surface of the semiconductor substrate from which both the patterned insulating layer and the spacers have been removed; and forming a third polycrystal silicon layer on the overall surface of the dielectric layer to form a plate electrode.

The latter object may also be achieved in yet another embodiment, which provides that the process for forming a spacer on each sidewall of the remaining insulating layer and the first polycrystal silicon layer after the etching process, may be substituted by a procedure for oxidizing the sidewall of the same first polycrystal silicon layer, as compared with the above first embodiment.

Yet another embodiment of the present invention for achieving the latter object replaces the process for forming a single insulating layer with a process for forming two layers with a different etching rates, and removing the two layers using respective etchants that have different etching rates.

DETAILED DESCRIPTION OF THE PREFERRED EMBODIMENT

The foregoing objects and advantages of the invention will become clear from the following detailed description of the invention, taken together with the accompanying drawings.

Figure 1A:
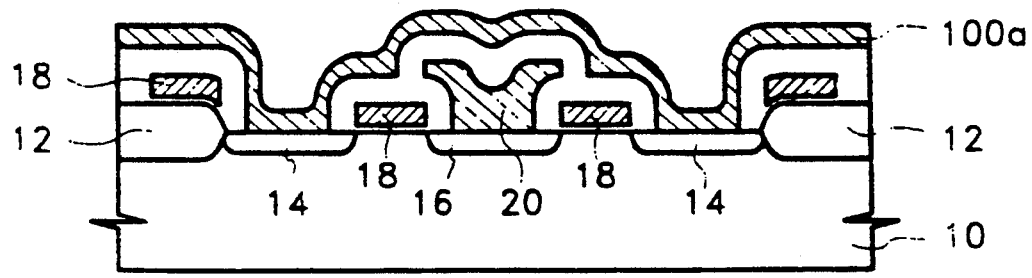
FIGS. 1A to 1C are sectional views illustrating the manufacturing process for a capacitor of a DRAM cell according to the conventional method.
Figure 1B:
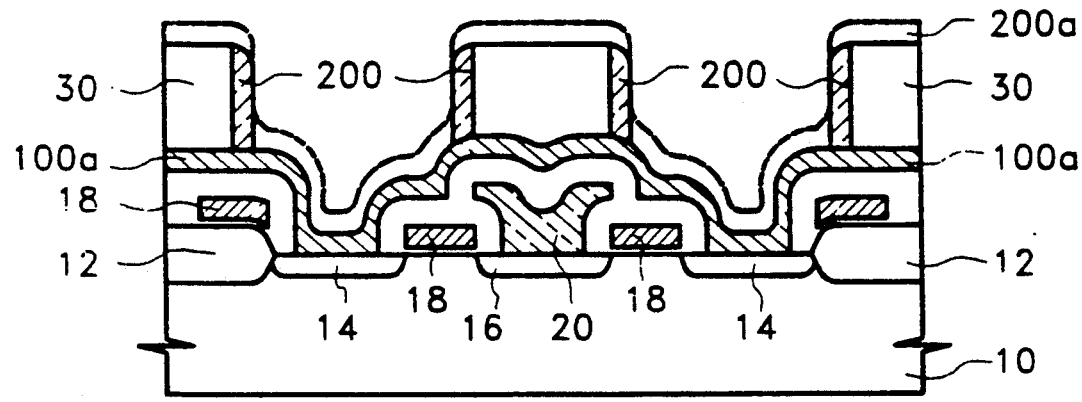
Figure 1C:
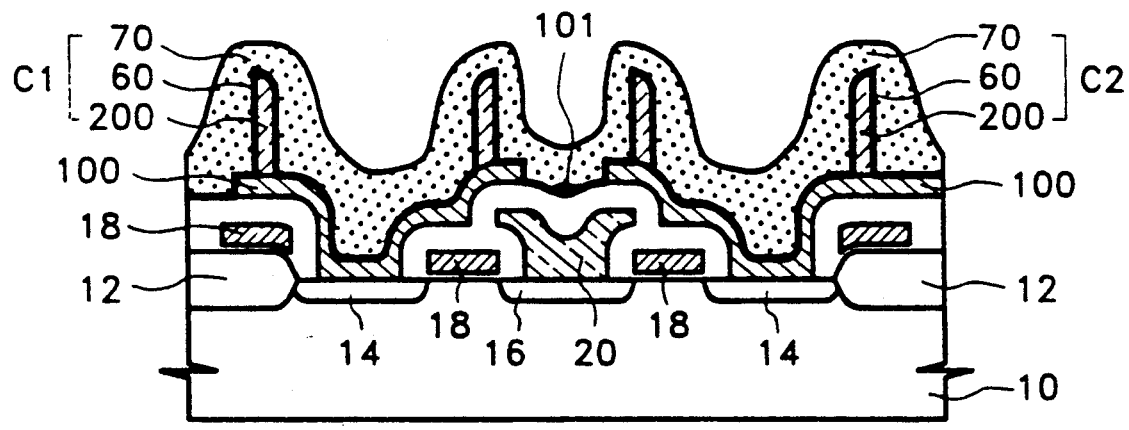
Figure 2:
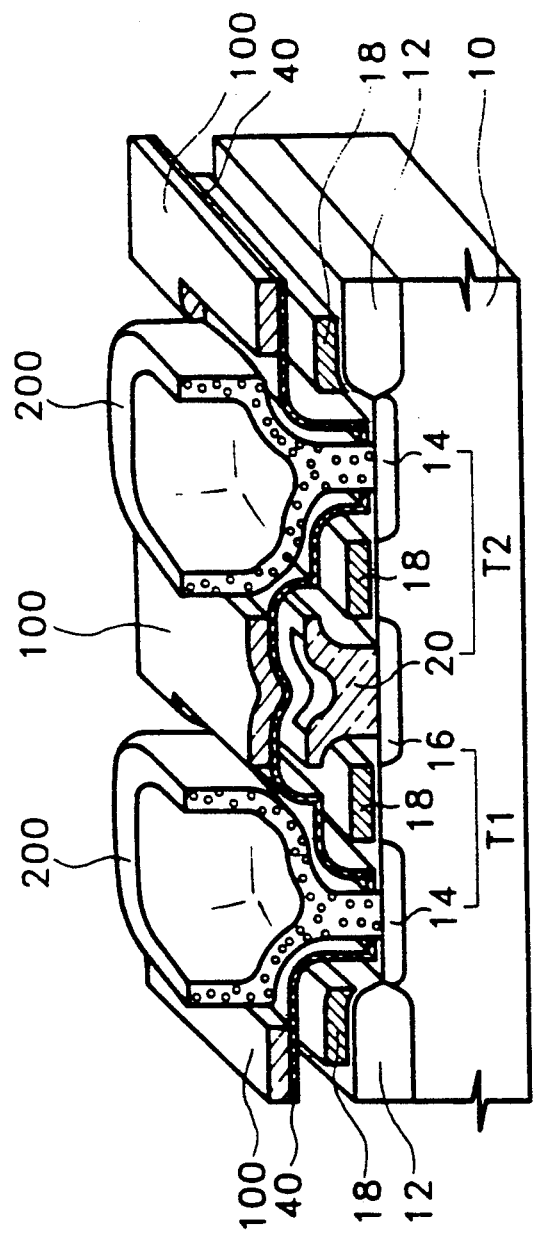
FIG. 2 is a cut-away perspective view of a high density semiconductor memory device, according to the present invention.

FIG. 2 is a cut-away perspective view of a semiconductor memory device according to the present invention. The semiconductor memory device according to the present invention is provided with transistors, $T_1$ and $T_2$, having respective sources 14 and gate electrodes 18 and holding both drain 16 and bit line 20 in common at the active region which is defined by field oxide layer 12 formed on semiconductor substrate 10, storage electrodes 200 electrically connected with the respective sources 14 of the transistors; and first polycrystal silicon layer 100 that is formed over all of the region except the region defined for forming the storage electrodes 200. The storage electrode 200 is electrically insulated from the first polycrystal silicon layer 100.

Because the above-mentioned surface is curved by transistors $T_1$ and $T_2$, bit line 20 and field oxide layer 12, some of the polycrystal silicon layer is formed thickly at the nook and coiner of the curves, and is not completely removed by the etching process. This polycrystal silicon remains there to form residue, serving as a bridge that electrically links separate cells, thereby destroying the data storing function of the memory cell capacitor.

According to the present invention, a polycrystal silicon layer is formed in advance in the recesses of a semiconductor substrate on which the residue of polycrystal silicon may be left, and is then insulated electrically from the storage electrode of each cell. By using this method, the data storing function breakdown of a cell capacitor can easily be prevented.

Referring now to FIGS. 3A through 3E, a more detailed explanation will be given of a semiconductor memory device according to the present invention. These drawings illustrate the successive states in the manufacturing process of one embodiment for manufacturing the above-mentioned semiconductor memory device.

Figure 3A:
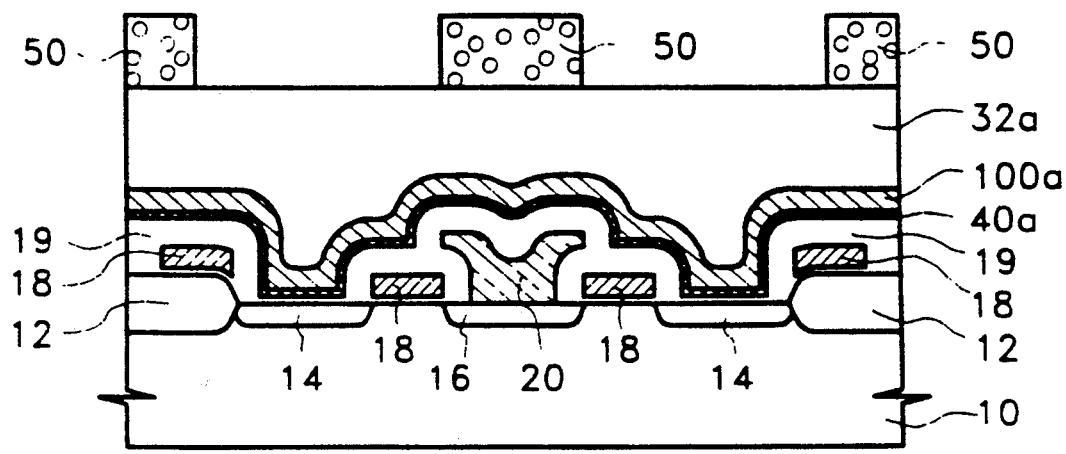
FIGS. 3A to 3E are sectional views illustrating another embodiment of the manufacturing process of a high density semiconductor memory device, according to the present invention.

FIG. 3A illustrates a process for forming a sensitive film pattern 50 after stacking up an etch blocking layer 40a, a first polycrystal silicon layer 100a and insulating layer 32a, on a semiconductor substrate. An etch blocking layer 40a, such as, silicon nitride $Si_3N_4$, may be thinly deposited over the entire surface of the semiconductor substrate on which the transistors are formed. These transistors each have a source 14 and a gate electrode 18, but have drain 16 and bit line 20 in common.

A polycrystal silicon layer 100a is then formed over the entire surface of the etch blocking layer 40a. The etch blocking layer 40a and first polycrystal silicon layer 100a are formed to take the shape of the lower structure, by being deposited with such commonly known methods as chemical vapor depositing ("CVD").

Next, an insulating layer 32a such as BPSG (Borophosphosilicate Glass) or TEOS (Tetia-Ethyl-Ortho Silicate), but not so limited, is deposited over the entire surface of the semiconductor substrate on which the first polycrystal silicon layer 100a is formed. The surface thereof is then planarized. It should be understood that the thickness of the insulating layer is an important factor in determining the height of the cylinder of the cylindric storage electrode structure, which in turn affects the capacitance of the cell. Accordingly, the height of the insulating layer may be adjusted to achieve a desired cell capacitance.

A sensitive film pattern 50 is formed by applying a mask pattern for forming a storage electrode, to a sensitive film that has been deposited over the entire surface of insulating layer 32a. The mask pattern is designed so that each storage electrode is sectioned into a unit of each cell, and connected with source region 14 of each respective transistor.

Notably, the etch blocking layer 40a and insulating layer 32a are formed from materials having different etch rates from each other in wet etching processes. In a wet etching process for removing the insulating layer 32a (to isolate the storage electrode from the first polycrystal silicon layer 100a), the etch blocking layer 40a prevents the wet etching of the inter-insulating layer 19. Accordingly, the inter-insulating layer 19 that is formed in order to isolate the gate electrode 18 is preserved.

$Si_3N_4$, and BPSG or TEOS, are common examples of materials having different etch rates for wet etching processes, that may be used to accomplish the foregoing functions. It should also be noted, that an impurity may be doped into the first polycrystal silicon layer 100a, without departing from the teachings of the invention.

Figure 3B:
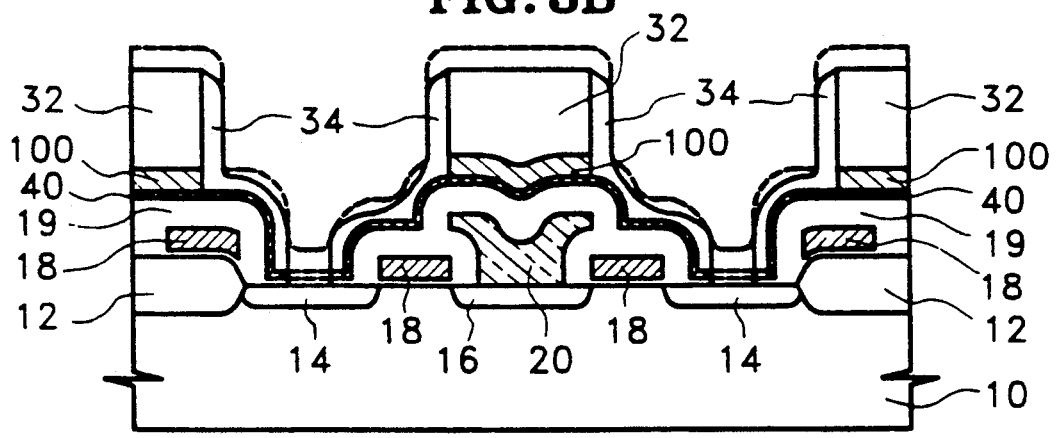

Referring now to FIG. 3B, the process for forming a spacer over the sidewall of the patterned insulating layer 32 and the sidewall of the first polycrystal silicon layer 100, is illustrated. The insulating layer 32a (as shown in FIG. 3A) is first dry-etched by using the sensitive film pattern 50 as a mask, after which the first polycrystal silicon layer 100 is also dry-etched by using both sensitive film pattern 50 and the patterned insulating layer 32 as a mask. From this, the same pattern as sensitive film pattern 50 is transmitted to both the insulating layer 32 and the first polycrystal silicon layer 100.

An oxide layer is then formed as a spacing layer over the entire surface of a semiconductor substrate that has a large different etch rate in dry-etching and has small different etch rate in wet-etching. Next, anisotropic etching is performed to leave an spacer 34 formed of the oxide layer, on each sidewall of the patterned insulating layer 32 and polycrystal silicon layer 100. During the anisotropic etching process, the insulating layer 32 is never removed because the spacing layer has a different etch rate compared to that of insulating layer 32.

It should be noted that not only is a spacer formed over the sidewall of the insulating layer 32 and the fast polycrystal silicon layer (patterned by the anisotropic etching), but that the exterior of transistor source 14 is also penetrated by the above etching process exposing the surface thereof. Advantageously, no additional process for forming a contact hole is needed.

Figure 3C:
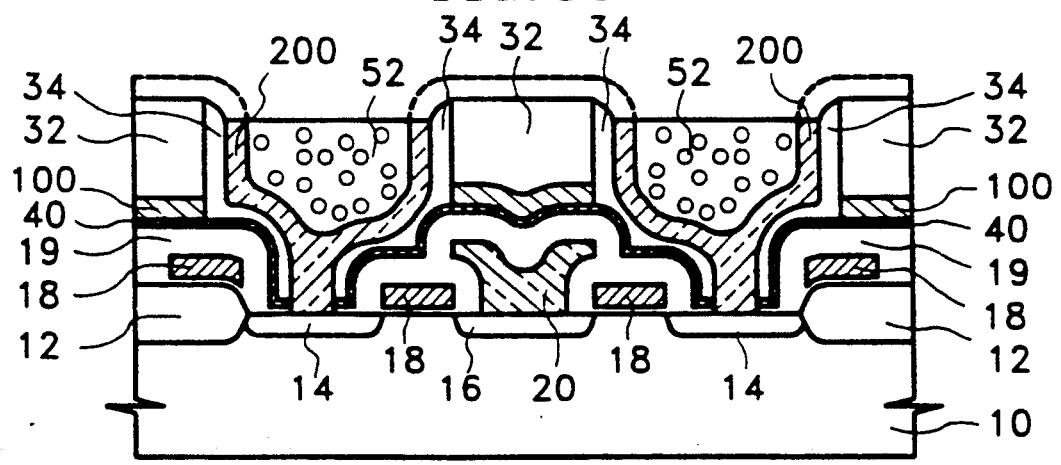

FIG. 3C illustrates the process for forming a storage electrode for each cell unit, in which a second (impurity doped) polycrystal silicon layer is coated or deposited by, for example, chemical vapor deposition techniques that are common in the industry, over the entire surface of the semiconductor substrate on which the spacer 34 is formed.

A sensitivity layer 52 is applied to the extent that the second polycrystal silicon layer is buried completely. The sensitivity layer is then etched back until the ridges of the surface of the curved second polycrystal silicon layer are exposed. Finally, a portion of the second polycrystal silicon layer that is exposed is removed by etching, completing a storage electrode 200 as defined by each cell unit.

As shown in FIG. 3C, the second polycrystal silicon layer, i.e., the storage electrode 200 and the first polycrystal silicon layer 100, are isolated from each other by the spacer 34 so that electrical insulation occurs between them, preventing the data of a cell capacitor from being destroyed by the residue of the polycrystal silicon layer 100.

Figure 3D:
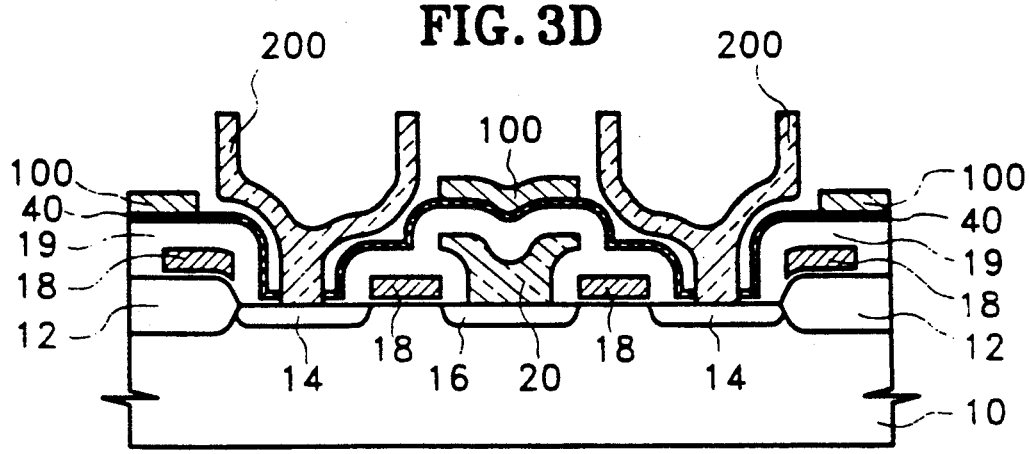

Referring now to FIG. 3D, the process for removing both insulating layer 32 and spacer 34, is illustrated. Here, the sensitivity layer 52 is removed, and the semiconductor substrate is dipped into an etchant to simultaneously remove both the insulating layer 32 and the spacer 34, whose respective etching late for wet etching are the same. During this time, the etch blocking layer 40 serves to protect the insulating layer 19 from the above-mentioned wet etching, so as to prevent the gate electrode 18 from being exposed.

Figure 3E:
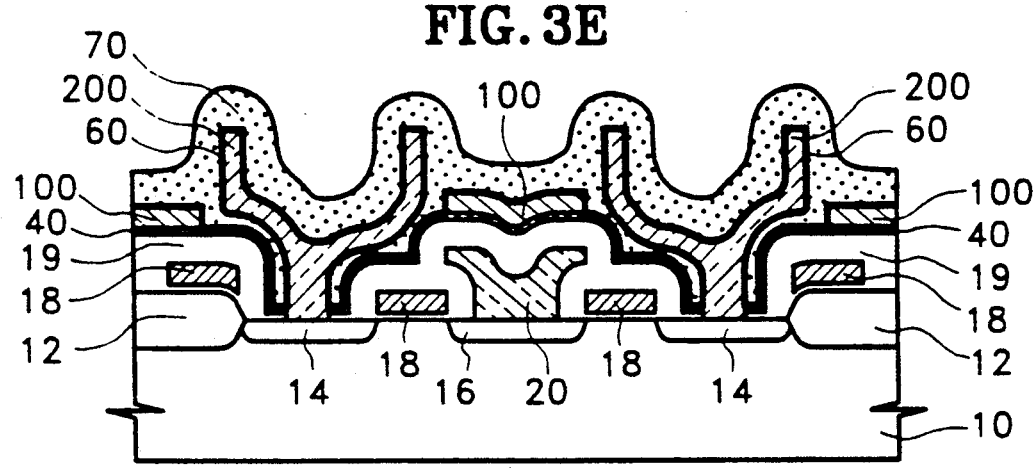

Referring to FIG. 3E, a high dielectric material such as $Ta_2O_5$, is thinly applied onto the whole surface of the semiconductor substrate from which the insulating layer 32 and spacer 34 are removed to form a dielectric layer 60. A third polycrystal silicon layer in which an impurity is doped is deposited on the whole surface of the dielectric layer 60, thereby completing a cell capacitor having the storage electrode 200, a dielectric layer 60 and a plate electrode 70. At this time, it may be desirable to leave the first polycrystal silicon layer 100 impurity free and not doped, or to make it, when doped, electrically connected to a plate electrode or ground.

FIGS. 4A through 4D are sectional views that illustrate a manufacturing process of another embodiment for manufacturing the semiconductor memory device according to the present invention. In the embodiment described above, the process of forming spacer 34 on the respective sidewalls of the patterned insulating layer 32 and first polycrystal silicon layer 100 is replaced by a process for oxidizing each sidewall of the fast polycrystal silicon layer 100.

Figure 4A:
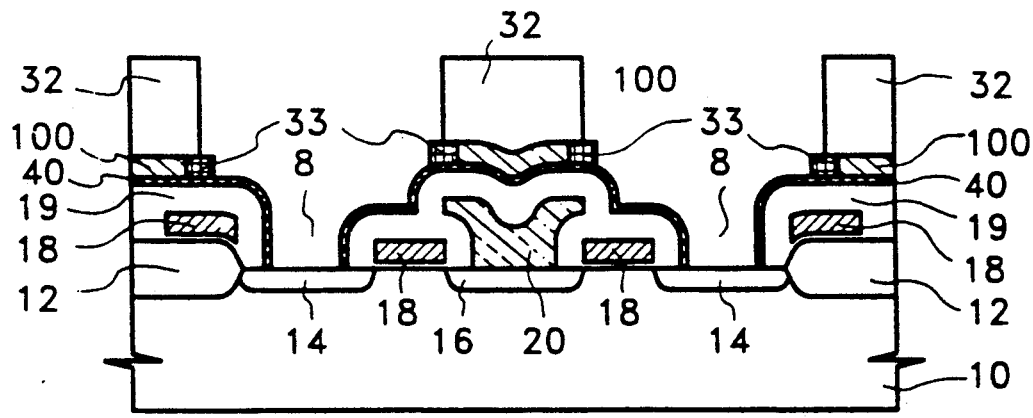
FIGS. 4A to 4D are sectional views illustrating another embodiment of the manufacturing process of a high density semiconductor memory device, according to the present invention.

FIG. 4A illustrates a process for forming an oxide layer 33 on each sidewall of a patterned first polycrystal silicon layer 100. The insulating layer 32 and first polycrystal silicon layer 100 are both patterned by using the sensitive film pattern 50 as a mask, as shown in FIG. 3A. By exposing the above semiconductor substrate (to which a pattern transmission is then completed) to an oxidized atmosphere, the oxide layer 33 is formed on each exposed sidewall of the first polycrystal silicon layer 100.

Next, a contact hole 8 is formed by a self-alignment method without any masking process. This can be accomplished because the thickness of the oxide layer formed on the transistor source 14 is so thin that if the oxide layer formed on the sidewall of the first polycrystal silicon layer 100 is exposed to an etching process for removing the etch block layer 40, the etch block layer 40, which is not shielded by either the insulating layer 32 or oxide layer 33, will be removed concurrently with the oxide layer deposited on the source 14. Accordingly, the formation of a self-aligning contact hole may be completed. The etch blocking layer 40 does have a different etching rates from both the insulating layer 32 and the oxide layer 33, which prevents the gate electrode from being exposed by the wet etching process used to remove the insulating layer 32 and the oxide layer 33.

Figure 4B:
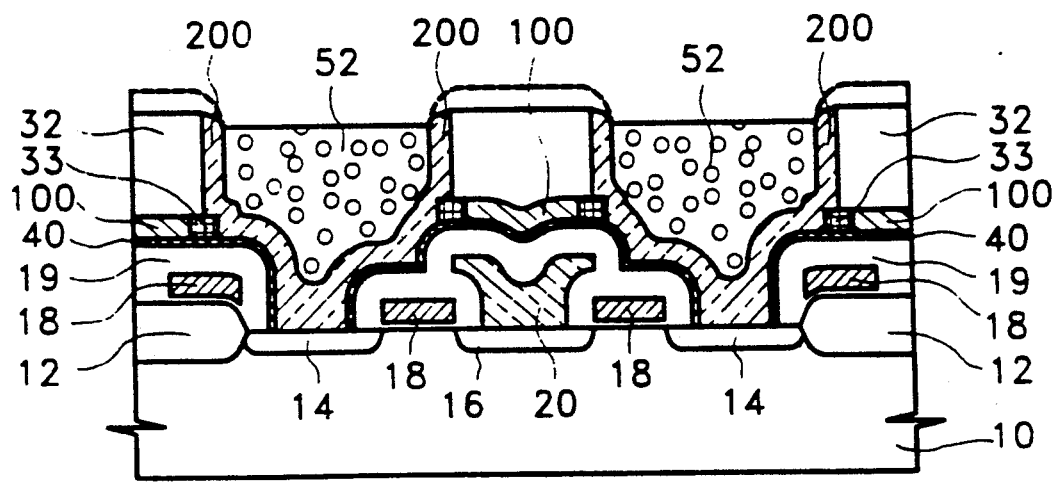

Referring now to FIG. 4B, the process for forming the storage electrode for each cell unit, is illustrated. In this step, the second polycrystal silicon layer in which an impurity is doped is deposited over the entire surface of the semiconductor substrate on which the oxide layer 33 exists, forming the storage electrode 200. Since the method to perform this step is identical to that described above with reference to FIG. 3C, it is unnecessary to repeat it here.

Figure 4C:
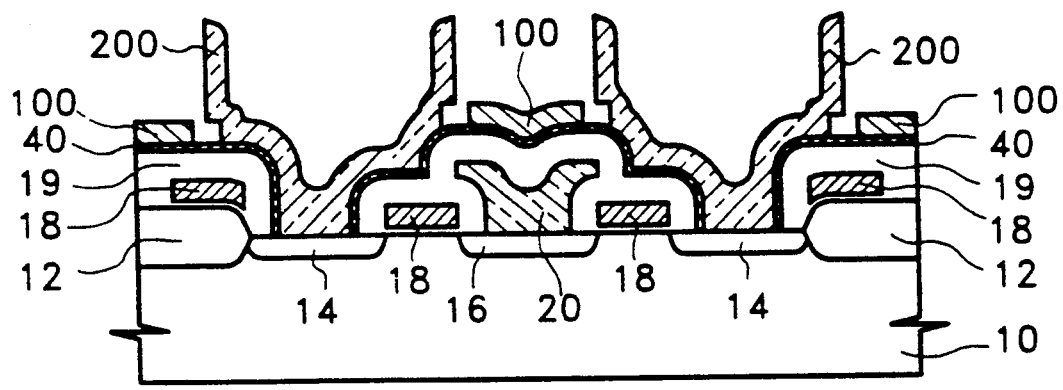
Figure 4D:
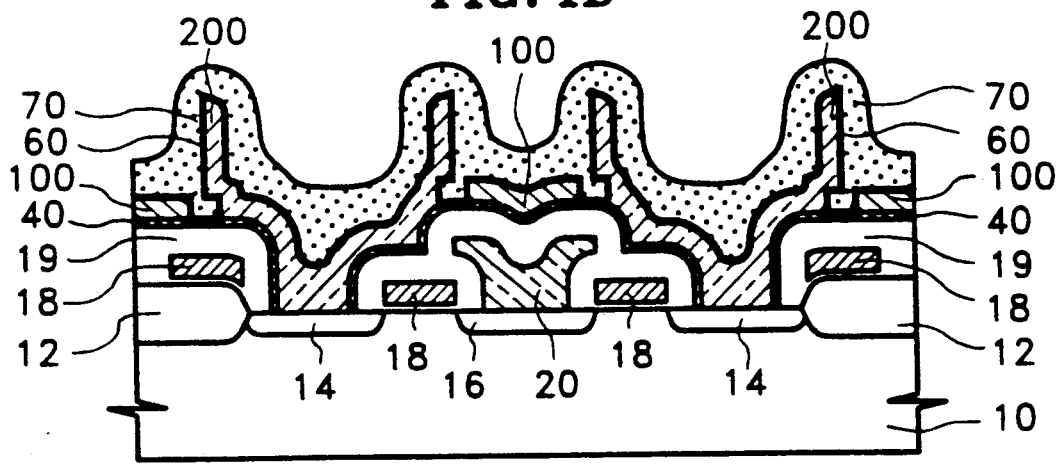

In FIGS. 4C and 4D, the process for completing a cell capacitor having a storage electrode 200, a dielectric layer 60 and a plate electrode 70 is shown. The insulating layer 32 and oxide layer 33 are first removed by etching, after which the dielectric layer 60 is formed over the entire surface of the semiconductor substrate. Then, the third polycrystal silicon layer doped with impurities is deposited to form a plate electrode 70. Accordingly, the process for a cell capacitor having a storage electrode 200, a dielectric layer 60 and a plate electrode 70 is completed. As shown in FIG. 4A through 4D, the spacer 34 by which the storage electrode 200 is isolated from the first polycrystal silicon layer 100 described above is replaced by the oxide layer 33 formed on each side wall of the first polycrystal silicon layer. In both embodiments, the same effect may be obtained.

Figure 5:
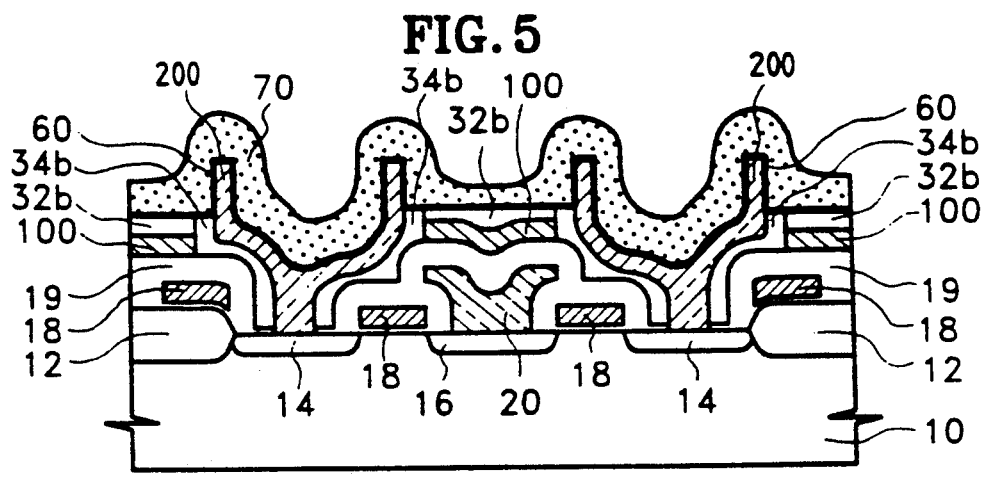
FIG. 5 is a sectional view showing still another embodiment of the manufacturing process of a high density semiconductor memory device, according to still another embodiment of the present invention.

FIG. 5 is a vertical sectional view of a semiconductor memory device of still another embodiment according to the present invention. If FIG. 5 the process in the above described first embodiment for removing the spacer 34 and the insulating layer 32 by wet etching (shown in FIG. 3D) is replaced by a process to remove only part of insulating layer 32 and spacer 34 by dry etching.

This embodiment is structured to eliminate a problem that may occur in the case where the wet etching used in the first embodiment causes excess removal of material. It can also prevent the cylindrical column of the second polycrystal silicon layer, that is supported by the spacer 34, from collapsing during the wet etching processes. The collapsing may occur because the thickness of the second polycrystal silicon layer is usually very thin, and the height of the cylindrical column is usually increased in order to secure a greater cell capacitance. Consequently, it is often the case that the thinly formed second polycrystal silicon layer collapses when the spacer 34, supporting the second polycrystal silicon layer, is removed by wet etching.

Figure 6A:
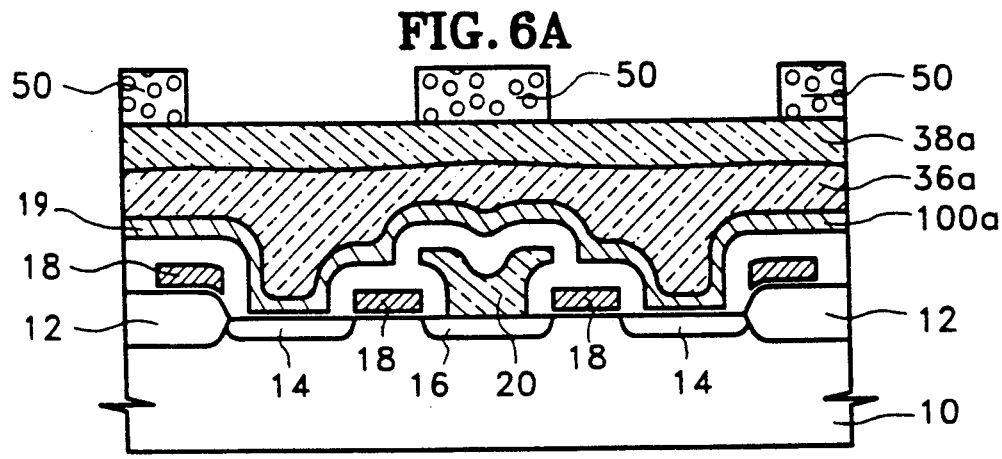
FIGS. 6A and 6B are sectional views for illustrating still another embodiment of the manufacturing process of a high density semiconductor memory device, according to the present invention.
Figure 6B:
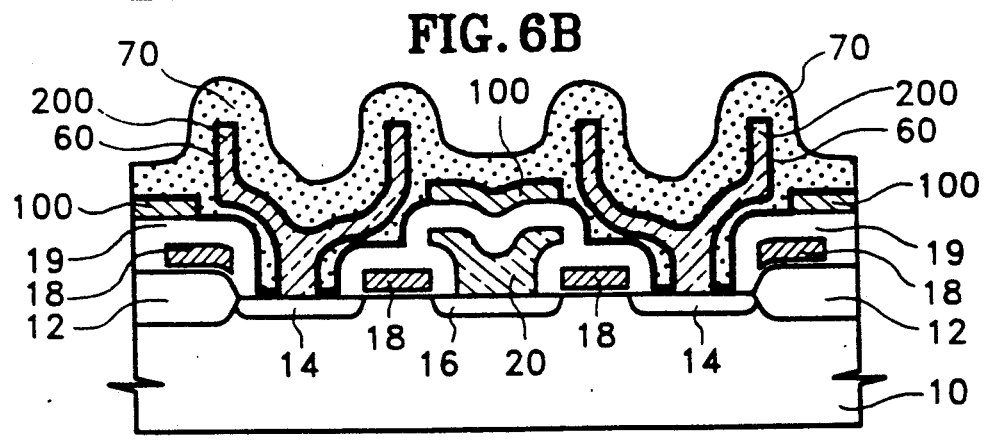

FIGS. 6A and 6B are sectional views respectively showing the process of yet another embodiment to manufacture a semiconductor memory device according to the present invention in which the etch blocking layer 40 and the single layered insulating layer 32, both used in the above-described first embodiment, are replaced by a multiple insulating layer of first insulating layer 36a and second insulating layer 38a having different etch rates from each other.

Referring to FIGS. 6A and 6B, the first insulating layer should not only be different from the second insulating layer in the etch rate, but it should also form a marked contrast to the inter-insulating layer 19 surrounding the gate electrode 18. Unfortunately, the etch blocking layer 40 that was deposited in the above described first embodiment is never deposited in the above described other embodiment.

After a portion of the spacer formed along with the sidewalls of the second insulating layer and the second insulating layer 38a is removed by dry etching with the same etch rate, the fast insulating layer and the spacer formed on the sidewall of the first insulating layer is removed by another etching process at a fast etching rate so that the inter-insulating layer 19 is not removed by the other etching process described above.

The first and second insulating layers are usually formed of insulating materials such as TEOS and BPSG, but the inter-insulating layer 19 may be formed from such insulating material as HTO (High-Temperature Oxide). The embodiment illustrated in FIGS. 6A and 6B is important because it offers a process which not only prevents a storage electrode from being destroyed by wet etching, but it also does not require an etch blocking layer.

Figure 7:
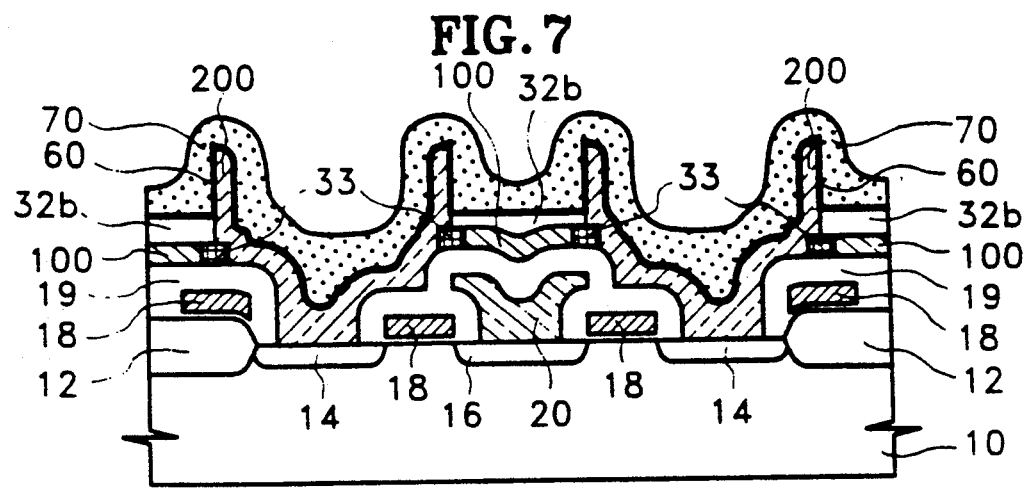
FIG. 7 is a vertical sectional view of yet another embodiment of the high density semiconductor memory device, according to the present invention.

FIG. 7 is a cross-sectional view of a semiconductor memory device according to still another embodiment of the present invention which combines the embodiment shown in the FIGS. 4A through 4D with the embodiment shown in FIG. 5.

Figure 8A:
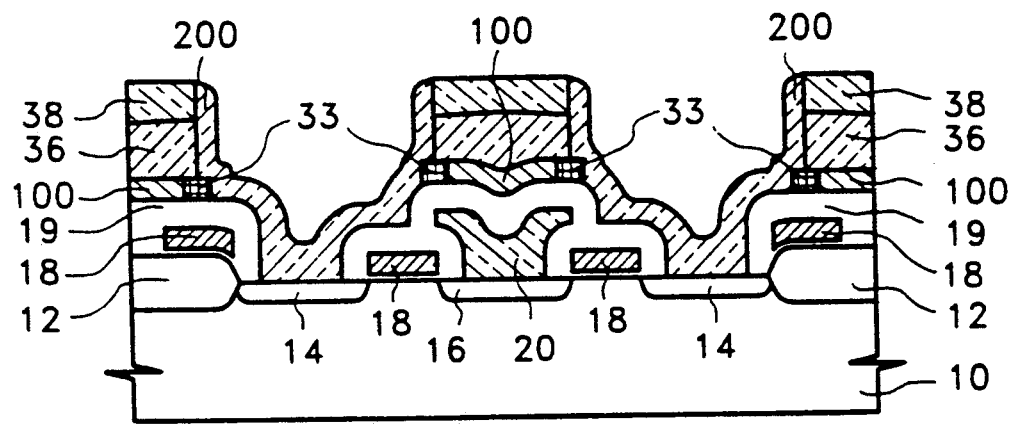
FIGS. 8A and 8B are sectional views for illustrating yet another embodiment of the manufacturing process of a high density semiconductor memory device, according to the present invention.
Figure 8B:
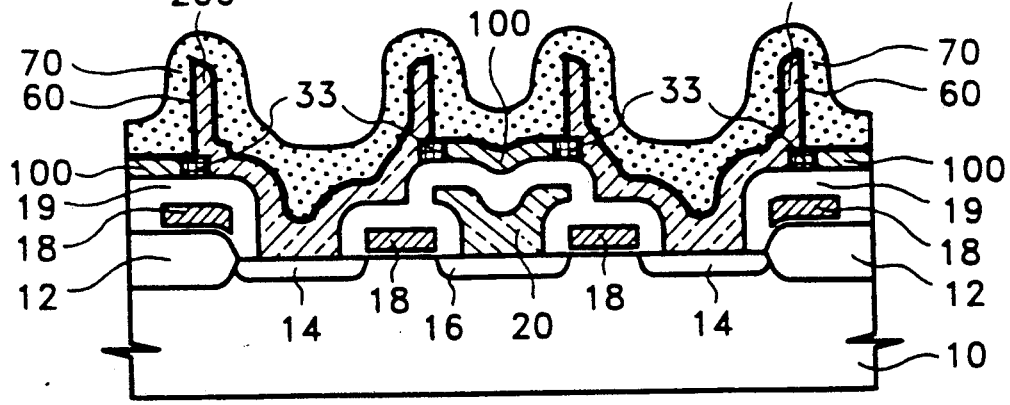

FIGS. 8A and 8B are sectional views illustrating the manufacturing process of yet still another embodiment implemented in order to manufacture a semiconductor memory device according to the present invention, which combines the embodiment shown in FIGS. 4A through 4D with the embodiment shown in FIGS. 6A and 6B.

As stated above, a polycrystal silicon layer is formed in advance, in the area that a residue of the polycrystal silicon layer may form. The polycrystal silicon layer formed in advance is intentionally isolated from the storage electrode, advantageously preventing the phenomenon in which the data stored in a cell capacitor is destroyed as a result of the residue of the polycrystal silicon layer.

Additionally, the surface can be planarized as much as the thickness of the polycrystal silicon layer that is formed in advance. It will be apparent to a person skilled in the art pertaining to the present invention, that if the polycrystal silicon layer becomes thickened when the height of cylinder was determined, then the unevenness of the surface of the upper structure will become lessened as much as the thickness of the polycrystal silicon layer.

The foregoing description of the preferred embodiments of the present invention has been presented for purposes of illustration only, and it will be understood that many modifications and variations will be apparent to practitioners skilled in the art without departing from the scope of the invention. It is therefore intended here that any such modifications and changes be covered by the following claims.

What is claimed is:

1. A method for manufacturing a memory device in which memory cells each comprising a transistor having a gate electrode, a drain and a source electrically connected to a capacitor having a storage electrode, a dielectric layer and a plate electrode, are formed on a semiconductor substrate in an orderly shape, comprising the steps of:

stacking an etch blocking layer, stacking a first polycrystal silicon layer and then stacking an insulating layer whose surface is planarized, over the entire surface of said semiconductor substrate on which said transistor is formed;

forming a photosensitive film pattern for forming said storage electrode on said insulating layer;

patterning said insulating layer and said first polycrystal silicon layer by using said photosensitive film pattern as a mask;

forming a spacer layer over the entire surface of the resultant substrate;

forming a spacer over the sidewalls of said patterned first polycrystal silicon layer and said insulating layer by etching said spacer layer;

forming a second polycrystal silicon layer over the entire surface of said semiconductor substrate on which said spacer is formed;

completing a storage electrode by partially etching said second polycrystal silicon layer to isolate each cell unit;

removing at least a portion of said patterned insulating layer and said spacer by etching;

forming a dielectric layer over the entire surface of the resultant semiconductor substrate; and forming a third polycrystal silicon layer over the entire surface of said dielectric layer, thereby, forming a plate electrode.

2. A method for manufacturing a semiconductor memory device according to claim 1, wherein said etch blocking layer in wet etching is formed of a material which has a different etch rate from that of the material forming said spacer.

3. A method for manufacturing a semiconductor memory device according to claim 2, wherein said etch blocking layer is a nitride.

4. A method for manufacturing a semiconductor memory device according to claim 1, wherein said first polycrystal silicon layer is a material which is not doped with an impurity.

5. A method for manufacturing a semiconductor memory device according to claim 1, wherein said first polycrystal silicon layer is a material into which impurity is doped.

6. A method for manufacturing a semiconductor memory device according to claim 5, wherein said first polycrystal silicon layer is electrically connected with said plate electrode.

7. A method for manufacturing a semiconductor memory device according to claim 5, wherein said first polycrystal silicon layer is connected to ground.

8. A method for manufacturing a semiconductor memory device according to claim 1, wherein said step of removing at least a portion of said patterned insulating layer and said spacer by etching consists of removing all of said patterned insulating layer and said spacer using wet etching.

9. A method for manufacturing a semiconductor memory device according to claim 8, wherein said insulating layer is either TEOS or BPSG.

10. A method for manufacturing a semiconductor memory device according to claim 8, wherein said spacer has a different etch rate for dry etching from that of said insulating layer, and the same or similar etch rates for wet etching.

11. A method for manufacturing a semiconductor memory device according to claim 1, wherein said step of removing at least a portion of said patterned insulating layer and said spacer consists of removing a portion of said patterned insulating layer and said spacer by dry etching, thereby, leaving a portion of said patterned insulating layer and said spacer on the top and sidewall of said first polysilicon layer.

12. A method for manufacturing a semiconductor memory device according to claim 11 wherein said insulating layer and said spacer are removed at the same etching rate.

13. A method for manufacturing a semiconductor memory device according to claim 1, wherein said step of completing a storage electrode by partially etching said second polycrystal silicon layer to isolate each cell unit comprises the steps of applying a first material over the entire surface of said semiconductor substrate on which said second polycrystal silicon layer is formed;

etching back said first material until upper portions of the curved surface of said second polycrystal silicon layer become exposed;

and etching the exposed portion of said polycrystal silicon layer.

14. A method for manufacturing a semiconductor memory device according to claim 13, wherein said first material has a different etch late from those of said insulating layer and said spacer for dry etching.

15. A method for manufacturing a semiconductor memory device according to claim 14, wherein said first material is a photoresist.

16. A method for manufacturing a semiconductor memory device in which memory cells each comprising a transistor having a gate electrode, a drain and a source electrically connected a capacitor having a storage electrode, a dielectric layer and a plate electrode, are formed on a semiconductor substrate in an orderly shape, said method comprising the steps of:

stacking an etch blocking layer, stacking a first polycrystal silicon layer, stacking an first insulating layer and then second insulating layer whose surface is flattened, over the entire surface of said semiconductor substrate;

forming a photosensitive film pattern for forming said storage electrode on said second insulating layer;

patterning said first and second insulating layer and first polycrystal silicon layer by using said photosensitive film pattern as a mask;

forming a spacer layer over the entire surface of the resultant substrate;

forming a spacer over the sidewalls of said patterned first polycrystal silicon layer and said first and second insulating layer, by etching said spacer layer;

forming a second polycrystal silicon layer over the entire surface of said semiconductor substrate on which said spacer is formed;

completing a storage electrode by partially etching said second polycrystal silicon layer to isolate each cell unit;

removing a portion of said spacer formed on the sidewall of said second insulating layer and said second insulating layer, by etching at the same etching late;

removing the remainder portion of said spacer formed on the sidewall of said first insulating layer and said first insulating layer by etching;

forming a dielectric film over the entire surface of the resultant semiconductor substrate; and forming a third polycrystal silicon layer over the entire surface of said dielectric film, thereby forming a plate electrode.

17. A method for manufacturing a semiconductor memory device according to claim 16, wherein said spacer, said first insulating layer and said second insulating layer are removed by dry etching.

18. A method for manufacturing a semiconductor memory device according to claim 17, wherein said first insulating layer is different in its etching late for dry etching from said second insulating layer and the inter-insulating layer formed to isolate said transistor.

19. A method for manufacturing semiconductor memory device according to claim 18, wherein the etching rate of said first insulating layer is greater than the etching rate of said inter-insulating layer.

20. A method for manufacturing a memory device in which memory cells each comprising a transistor having a gate electrode, a drain and a source electrically connected to a capacitor having a storage electrode, a dielectric layer and a plate electrode, are formed on a semiconductor substrate in an orderly shape, said method comprising the steps of:

Stacking etch blocking layer, stacking a first polycrystal silicon layer, and then stacking an insulating layer whose surface is flattened, over the entire surface of said semiconductor substrate;

forming a photosensitive film pattern for forming said storage electrode on said insulating layer;

patterning said insulating layer and first polycrystal silicon by using said photosensitive film pattern as a mask;

forming an oxide layer by oxidizing the sidewall of said patterned first polycrystal silicon layer;

forming a contact hole on said source of said transistor;

forming a second polycrystal silicon layer over the entire surface of said semiconductor substrate on which said contact hole is formed;

completing a storage electrode by partially etching said second polycrystal silicon layer to isolate each cell unit;

removing said insulating layer and said oxide layer formed on the sidewall of said first polycrystal silicon layer;

forming a dielectric film over the entire surface of the resultant semiconductor substrate; and forming a thud polycrystal silicon layer over the entire surface of said dielectric film, thereby forming said plate electrode.

21. A method for manufacturing a semiconductor memory device according to claim 20, wherein said contact hole is formed by self alignment without any masking process.

22. A method for manufacturing a semiconductor memory device according to claim 20, wherein said insulating layer and said oxide layer have the same or a similar etch rates for wet etching.

23. A method for manufacturing a semiconductor memory device according to claim 20, wherein said oxide layer and said insulating layer is removed by wet etching.

24. A method for manufacturing a semiconductor memory device according to claim 20, wherein said insulating layer is composed of a first and second insulating layers having etching rate that are different from each other for dry etching.

25. A method for manufacturing a semiconductor memory device according to claim 24, wherein said first insulating layer has an etching rate that is different from the inter-insulating layer formed to isolate said transistor for dry etching.

26. A method for manufacturing a semiconductor memory device according to claim 25, wherein said first insulating layer is etched faster than said inter-insulating layer.

27. A method for manufacturing a semiconductor memory device according to claim 20, wherein both said oxide layer and said insulating layer are partially removed by dry etching.

* * * * *